United States Patent
Stanley et al.

(10) Patent No.: US 8,389,939 B1
(45) Date of Patent: Mar. 5, 2013

(54) SYSTEM AND METHOD OF DUAL ENERGY RADIATION DETECTION

(75) Inventors: James H. Stanley, Palo Alto, CA (US); Steven E. Koenck, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/245,391

(22) Filed: Sep. 26, 2011

(51) Int. Cl.
*G01J 5/02* (2006.01)
(52) U.S. Cl. .................................. 250/332; 250/339.02
(58) Field of Classification Search .................. 250/332
See application file for complete search history.

(56) References Cited

U.S. PATENT DOCUMENTS

| | | | | |
|---|---|---|---|---|
| 2004/0108564 A1* | 6/2004 | Mitra | ........................... | 257/442 |
| 2006/0097176 A1* | 5/2006 | Szu | ........................ | 250/370.08 |
| 2008/0251723 A1* | 10/2008 | Ward et al. | ................. | 250/338.4 |
| 2010/0044569 A1* | 2/2010 | Hung | ......................... | 250/338.4 |
| 2010/0078067 A1* | 4/2010 | Jia et al. | ........................ | 136/256 |
| 2010/0127172 A1* | 5/2010 | Nikoobakht | .................. | 250/332 |
| 2011/0194100 A1* | 8/2011 | Thiel et al. | ...................... | 356/51 |

* cited by examiner

*Primary Examiner* — Marcus Taningco
(74) *Attorney, Agent, or Firm* — Donna P. Suchy; Daniel M. Barbieri (57) ABSTRACT

A system and method for providing an apparatus for detecting radiance at a plurality of wavelengths is disclosed. The system and method includes an arrayed pixel sensor with a plurality of sub-pixel sections including a first sub-pixel section configured to detect radiance received from a radiating body at a first wavelength and a second sub-pixel section configured to detect radiance received from the radiating body at a second wavelength. The system and method also determines a ratio of the radiance detected at the first wavelength and the radiance detected at the second wavelength to determine a temperature of the radiating body based on the ratio.

21 Claims, 10 Drawing Sheets

SYSTEM AND METHOD OF DUAL ENERGY RADIATION DETECTION

BACKGROUND

The present disclosure relates generally to the field of detecting the radiance of objects with a pixel array. More particularly, the present disclosure relates to detecting the radiation emitted from various objects at specific wavelengths in order to determine the temperature of the various objects. This technology can be used in variety of applications including but not limited to thermal imaging, medical imaging, night vision, hyper-spectral imaging, head-up display (HUD) systems and wearable displays, such as, helmet mounted display (HMD) systems, and object detection such as automatic target recognition (ATR).

In the field of infrared (IR) radiation detection, methods of improving detection accuracy at low costs and low processing latency is greatly desired. Some radiation imaging systems use an array of photodiodes or microbolometers to capture radiation emitted from various objects to detect, for example, infrared energy information to be displayed for a user. Conventional single energy detection systems have limited responsivity, meaning the detectors used in these systems are only able to detect a relatively low portion of the incident energy associated with the radiance of an object captured by a given pixel in an pixel photodiode array. Furthermore, they cannot determine the temperature of an object without resorting to object-specific calibration procedures.

For example, certain radiating objects, such as human beings, are only slightly above room temperature and are more easily detected in the long wavelength IR band in a wavelength range of 8 to 12 μm while objects well above room temperature, such as an operating vehicle engine can be more readily detected in the middle wavelength IR band in a wavelength range of 2 to 5 μm. Accordingly, only detecting a narrow range of the IR spectrum can result in sub-optimal object detection. A radiation detection system capable of accurately imaging across a broad range of wavelengths in an inexpensive manner with low processing latency is desired.

SUMMARY

An exemplary embodiment relates to an apparatus for detecting radiance at a plurality of wavelengths that includes an arrayed pixel sensor with a plurality of sub-pixel sections where each sub-pixel section includes a first sub-pixel section configured to detect radiance received from a radiating body at a first wavelength and a second sub-pixel section configured to detect radiance received from the radiating body at a second wavelength. The apparatus also includes an array of metallic nanostructures contained in the plurality of sub-pixel sections wherein the metallic nanostructures have a first characteristic size for at least a first sub-pixel section and a second characteristic size for at least a second sub-pixel section, an electrical detector functionally connected to each sub-pixel section and at least one memory. Additionally, the apparatus also includes at least one processor configured to execute computer program stored in the at least one memory to determine a ratio of the radiance detected at the first wavelength and the radiance detected at the second wavelength and determine a temperature of the radiating body based on the ratio.

Another exemplary embodiment relates to a method for determining a thermal image based on radiance detected from a radiating body at a plurality of wavelengths. The method includes the steps of detecting radiance received from a radiating body at a first wavelength using a first sub-pixel section of an arrayed pixel sensor comprising an array of metallic nanostructures of a first characteristic size, detecting radiance received from the radiating body at a second wavelength using a second sub-pixel section of the arrayed pixel sensor comprising an array of metallic nanostructures of a second characteristic size, determining a ratio of the radiance detected at the first wavelength and the radiance detected at the second wavelength and determining a temperature of the radiating body based on the ratio.

BRIEF DESCRIPTION OF THE DRAWINGS

Exemplary embodiments are hereafter described, wherein like reference numerals denote like elements, and.

DETAILED DESCRIPTION OF THE PREFERRED EMBODIMENTS

Before describing in detail the particular improved system and method, it should be observed that the invention includes, but is not limited to a novel structural combination of conventional data/signal processing components and communications circuits, and not in the particular detailed configurations thereof. Accordingly, the structure, methods, functions, control and arrangement of conventional components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

Figure 1:
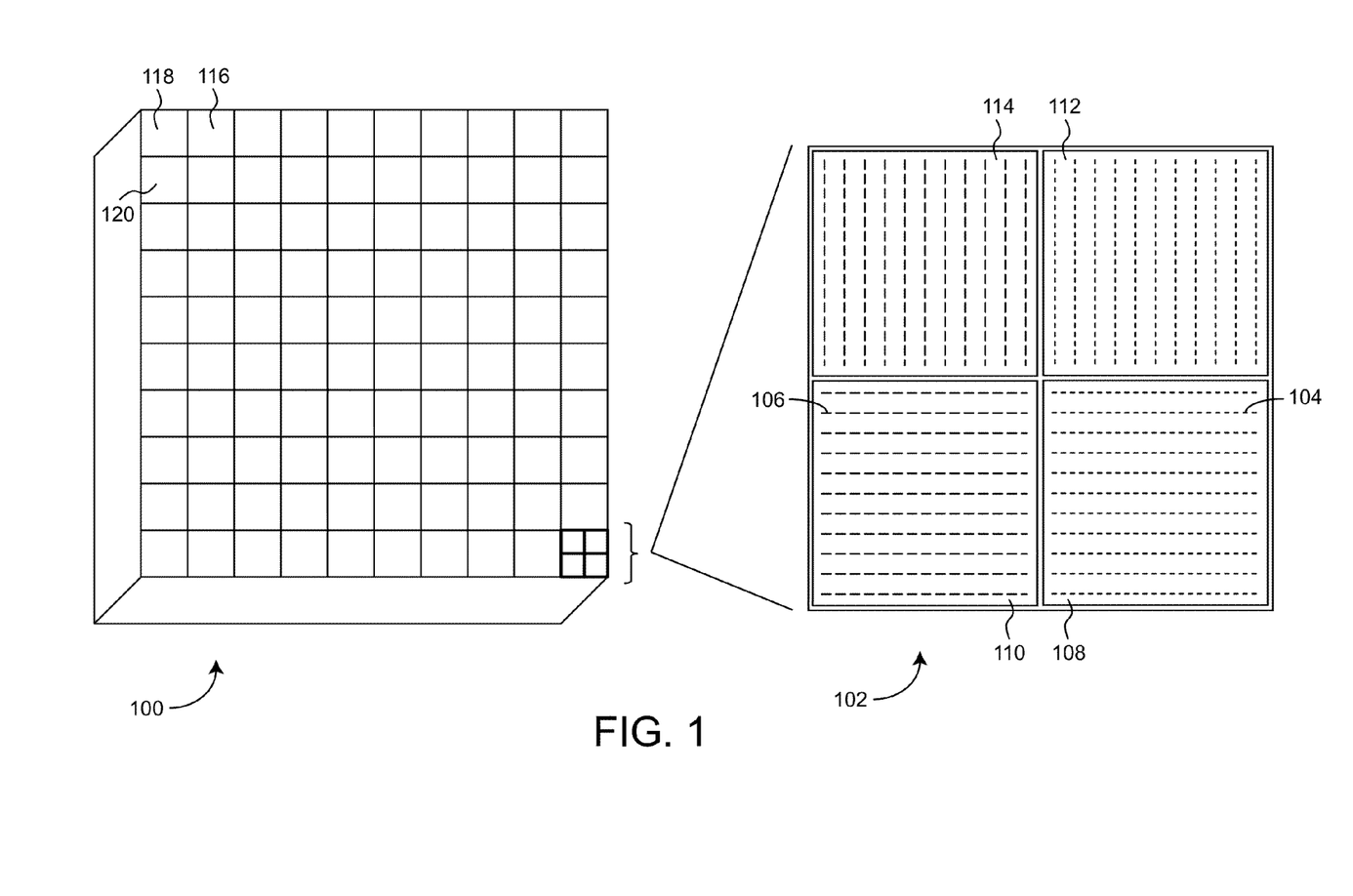
FIG. 1 is a schematic diagram of one embodiment of an arrayed pixel detector with sub-pixel sections.

Referring to FIG. 1, a pixel array detector (PAD) 100 made up of rows and columns of pixel detectors is depicted. In general, PAD's include a two dimensional pixilated surface including a cross section of pixel detectors such as 116, 118, and 120 that absorb radiation across a spectrum of wavelength ranges including ranges from the near infra-red radiation to the deep infra-red radiation, for example. Each pixel detector 116, 118, and 120 may include an absorption layer which may be a dielectric medium such as a silicon medium to absorb radiation received at the pixilated surface of PAD and to convert the absorbed radiation into an electrical signal. The absorption layer 208, in FIG. 2 and is described in further detail below.

Figure 2:
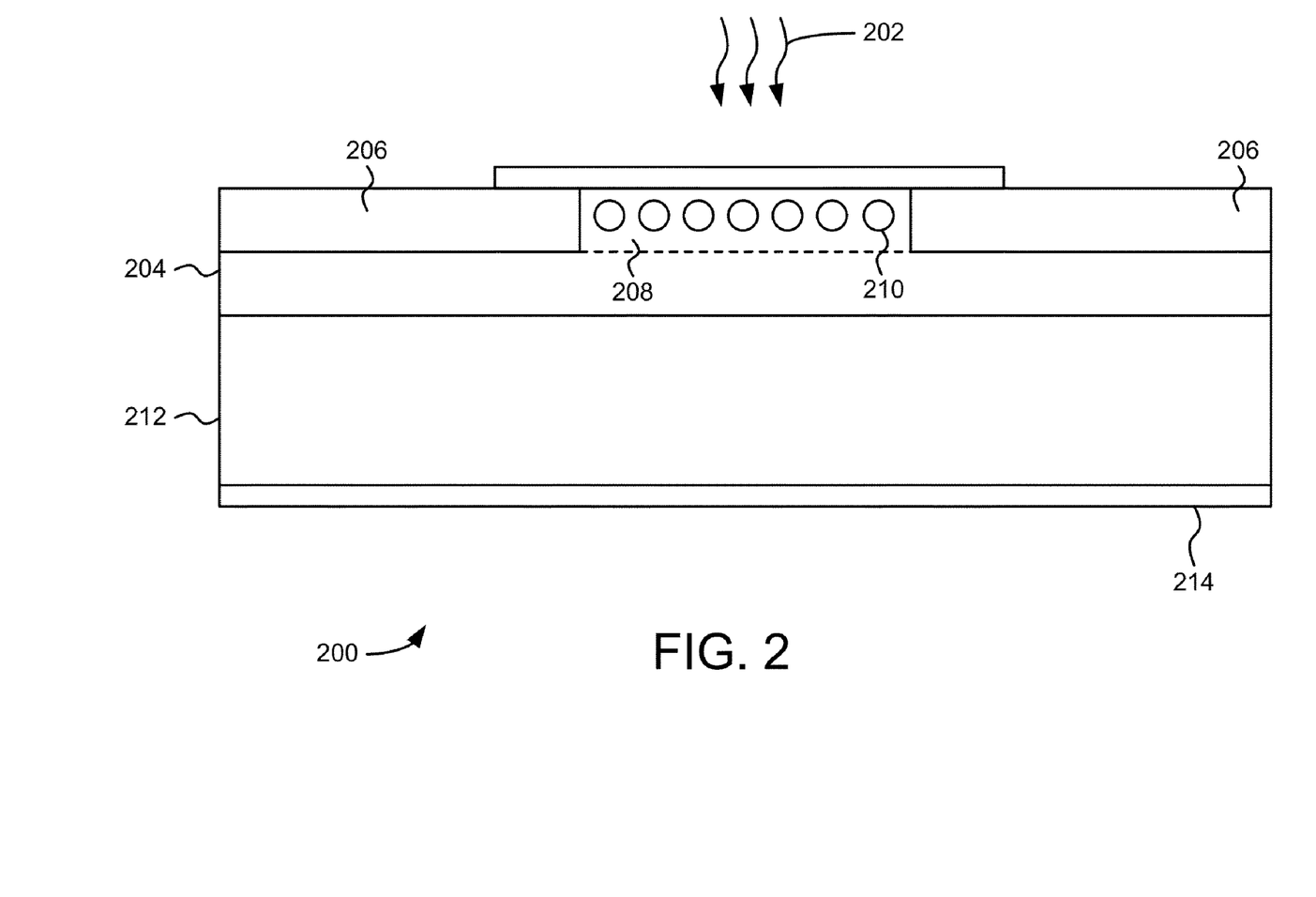
FIG. 2 is a side-perspective view of a schematic diagram of one sub-pixel section in accordance with one exemplary embodiment.

Each pixel detector 116, 118 and 120 may also include an additional layer, such as a gain amplification layer, to detect the electrical signal. After the electrical signal such as a current or voltage is detected, the electrical signal may then be input into an integrated circuit such as an application specific integrated circuit (ASIC), a readout integrated circuit (ROIC), or other integrated circuit 212 as shown in FIG. 2. The electrical signal may be conditioned or amplified at integrated circuit 212. The integrated circuit may be configured to rapidly store an electrical signal from each pixel detector 116, 118 and 120 at predetermined intervals so at each of the predetermined intervals a pixilated image frame is produced, according to one exemplary embodiment. For example, the integrated circuit may store an electrical signal from each pixel in the PAD every 1/30th of a second in order to produce a standard 30 frame per second video signal. In some embodiments, the columns and rows of pixel detectors correspond to the columns and rows of pixel data in an image or video which may be forwarded to storage or a display device.

According to one exemplary embodiment, each pixel 116, 118, and 120 in the PAD is divided in to sub-pixel sections. Each pixel may be divided into two, three, four or more sub-pixel sections. For example, pixel detector 102 is divided into four sub-pixel sections, 108, 110, 112, and 114. Furthermore, FIG. 2 depicts one exemplary embodiment of a side view of each sub-pixel section 108, 110, 112 and 114. As shown in FIG. 1, each sub-pixel section includes an array of metallic elements 104, 106. According to one exemplary embodiment, the metallic elements 104, 106 are gold nanostructures having a cylindrical cross section and a predetermined length. As shown in FIG. 2, the metallic nanostructures may be suspended in a dielectric medium 208, such as silicon. The metallic nanostructures 104, 106 may be arranged in rows and/or columns as shown in FIG. 1. Furthermore, the metallic nanostructures 104, 106 may be nanostructures with a length between approximately 1 and 1000 nanometers (nm), according to one exemplary embodiment. According to one exemplary embodiment, the metallic nano-rods are made of gold. The dielectric medium 208 may be a semiconductor material, such as silicon for example, according to one embodiment.

The inclusion of metallic nanostructures 106, 104 in sub-pixel sections 108, 110, 112 and 114 improves upon prior art PAD's by improving the responsivity of the photo detection process. In general, responsivity measures the input-output gain of a detector system. In the case of photodetectors, responsivity is a measure of the amount of electrical signal detected per optical input signal received at the photodetector. Responsivity of a photodetector may be expressed as Ampere's per Watt (A/W) or Volts per Watt (V/W), for example. Responsivity is a function of the properties of photodetector 200, but also of the wavelength of the incident radiation 202 received at a given photodetector 200. The metallic nanostructures 210 improve upon the responsivity of known photodetectors by using plasmonic resonances, or more precisely, localized surface plasmons. In one exemplary embodiment, plasmonic resonances occur when incident radiation waves 202 resonantly excite electron resonances of the gold nanostructures 210. The excitations, or plasmonic resonances, are localized in the in individual nanostructures 210. Subsequently, a Schottky barrier is formed at the boundary between each of the metallic gold nanostructures 210 and the surrounding dielectric material 208. Resonant electrons are then emitted over and through the Shottkey barrier into the dielectric material region 208 forming an electrical signal that is detected ROIC 212, for example.

Figure 3:
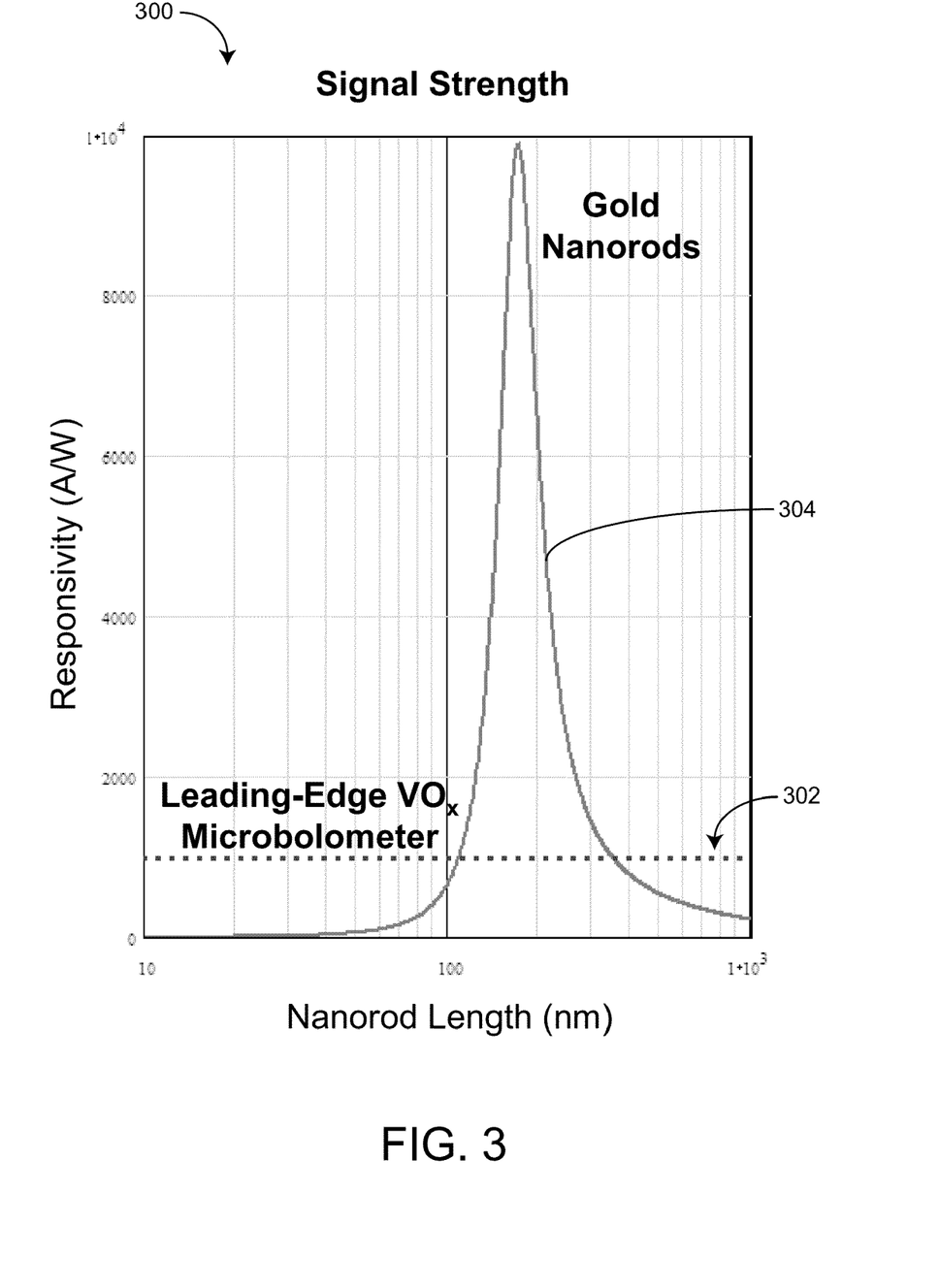
FIG. 3 is a graph depicting levels responsivity for arrayed pixel detectors according to one exemplary embodiment.

Furthermore, the dimensions of nanostructures 210 such as nan-rods contribute to the responsivity of photodetector 200. For example, the size of nanostructures 210 as well as the spacing between rows or columns of nanostructures 210 increases or decreases the responsivity of photodetector 200 at particular wavelengths. According to one exemplary embodiment, nano-rods with a 10 nm diameter and a length of 215 nm result in peak responsivity for radiance 202 that has a wavelength of 10 microns. FIG. 3 depicts the results of a simulation where radiance with a peak wavelength of 10 microns was received at a photodetector containing gold nano-rods of varying lengths as shown by the x axis of FIG. 3. As demonstrated by responsivity curve 304, photodetectors including gold nano-rods having a length of 215 nm exhibit a high degree of responsivity for incident radiance with a peak wavelength of 10 microns. Furthermore, the degree of responsivity is superior to the responsivity of conventional microbolometer photodetectors as shown by dashed line 302. Furthermore, the responsivity of the nanostructures is more narrowly tuned to a specific wavelength as seen by responsivity curve 304 in FIG. 3.

Figure 6:
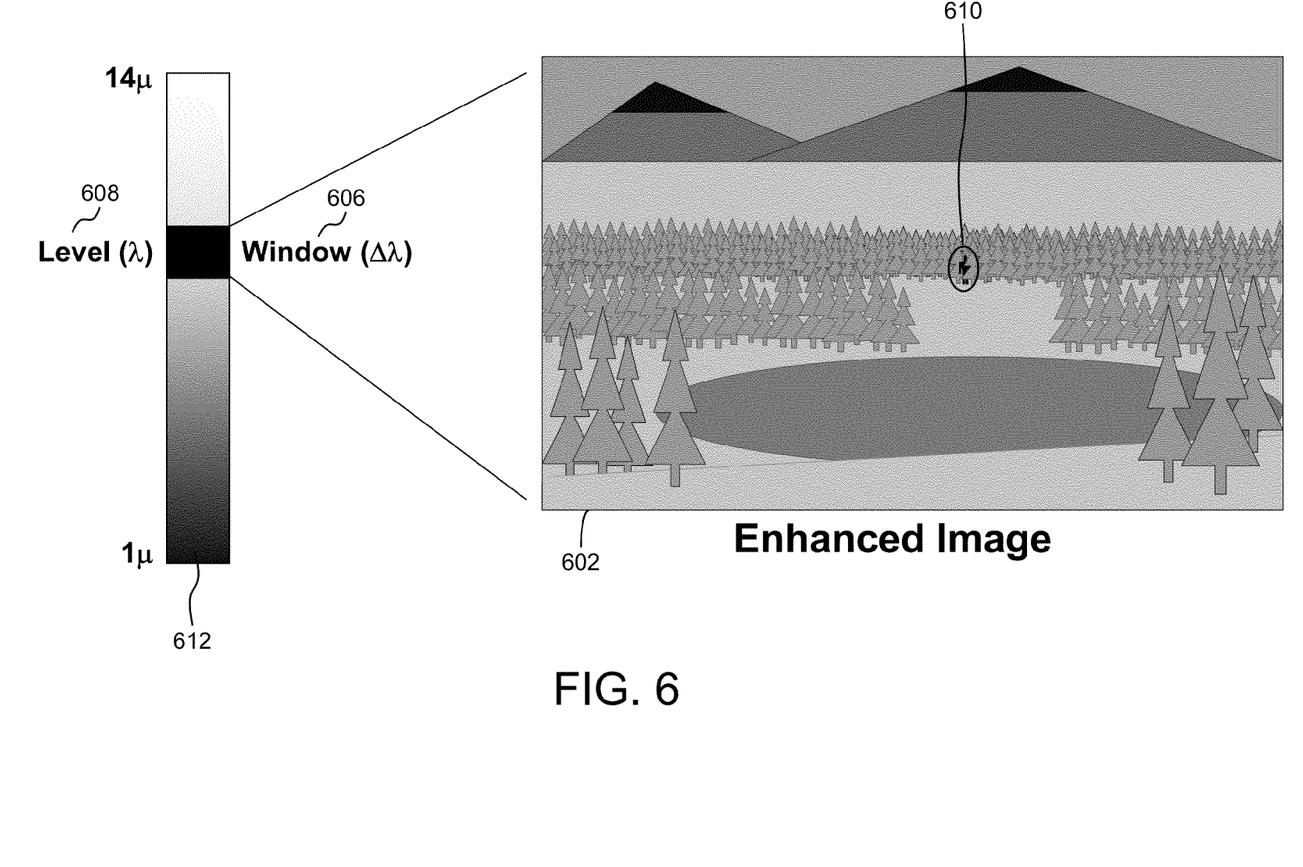
FIG. 6 is an example of display data resulting from detected radiance that may be altered according to a control signal according to one exemplary embodiment.

Because photodetectors 200 that include metallic nanostructures 210 such as metallic nan-rods result in a photo detection that has a very high degree of responsivity at specific wavelengths, on object of the disclosed embodiments is to determine the temperature of bodies emitting radiation by detecting a first energy or wavelength and also a second energy or wavelength being emitted from that radiating body. For example, PAD 100 may be configured to determine the temperature of objects emitting radiation in and external scene 602 as shown in FIG. 6. Various elements in the scene including the mountains, trees, lake, and human being 610.

Figure 7:
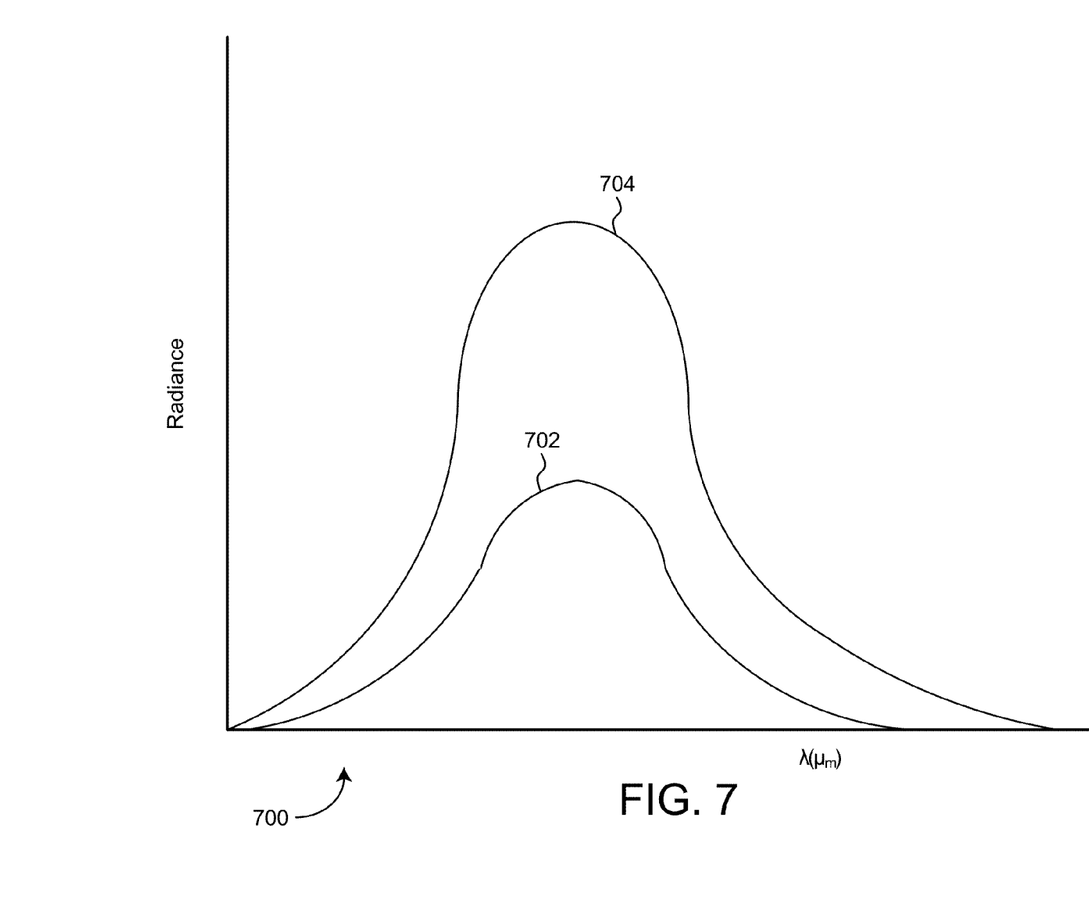
FIG. 7 is a diagram depicting the conceptual difference between blackbody radiation and grey body radiation according to one exemplary embodiment.

All bodies such as the bodies depicted in FIG. 6 absorb and emit some electromagnetic radiation. A body that theoretically absorbs all radiation falling on it at all wavelengths is called a black body. In practice, a bodies' black body radiation curve, such as curve 406, can be calculated by taking into account an emissivity constant that depends on the property of the surface of the body emitting radiance. The emissivity for a theoretically perfectly absorbing body is equal to 1. The emissivity of bodies in real world applications is reduced by an emissivity constant ranging from just above 0 to just under 1. For example, snow is highly reflective to visible light and has a relatively high emissivity constant at visible light wavelengths. Furthermore, metallic bodies typically have a low emissivity that increases as temperature increases while nonmetallic bodies typically have a high emissivity that decreases as temperature increases. FIG. 7 is another depiction of a theoretical black body radiation curve 704 for a particular radiating body at a particular temperature over a range of wavelengths while curve 702 the radiation levels that are emitted by an object with an emissivity less than 1, for example. As seen in FIG. 7, the emissivity constant acts as a filter for the block body radiation curve, uniformly reducing the radiance of the body at each wavelength.

Figure 4:
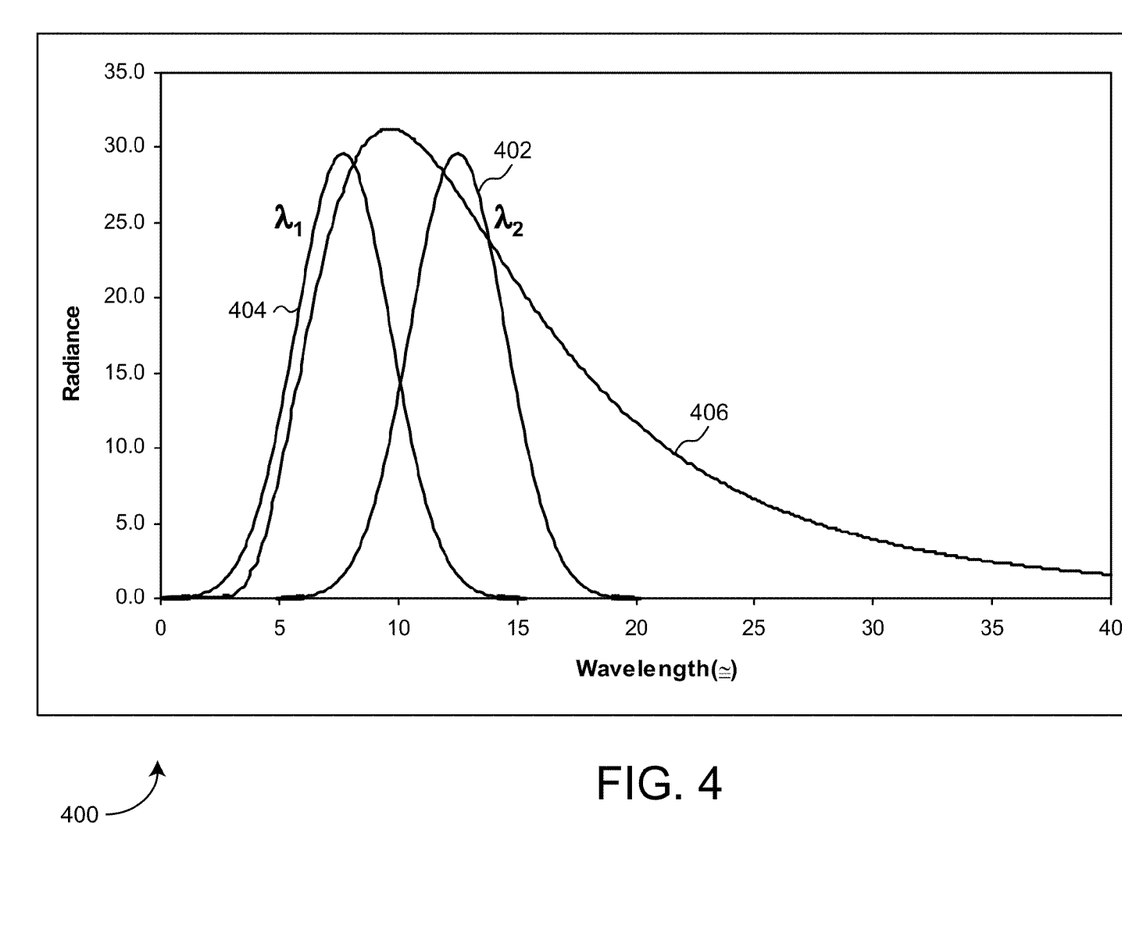
FIG. 4 is a graph depicting the detected radiance of a radiating body at a first and second wavelength according to one exemplary embodiment.

Referring to FIG. 4, a grey body radiation curve 406 for a particular radiating body such as a mountains, tree, lake, or human being 610 shown in FIG. 6 can be determined by detecting the radiance of the body at two wavelengths, $\lambda 1$ 404 and $\lambda 2$ 402. FIG. 4 depicts the grey body radiation spectrum for an exemplary body across a wavelength range between 1 and 40 microns. Because the grey body curve 406 is of the same shape as the bodies' theoretical black body curve with a dampened amplitude as determined by an emissivity constant, the ratio of detected grey body curve at a first and second wavelength is directly related to the temperature of the radiating body. Accordingly, by detecting a given body at a first and second wavelength, the temperature of the radiating body can be determined by dividing the first wavelength by the second wavelength.

Figure 5:
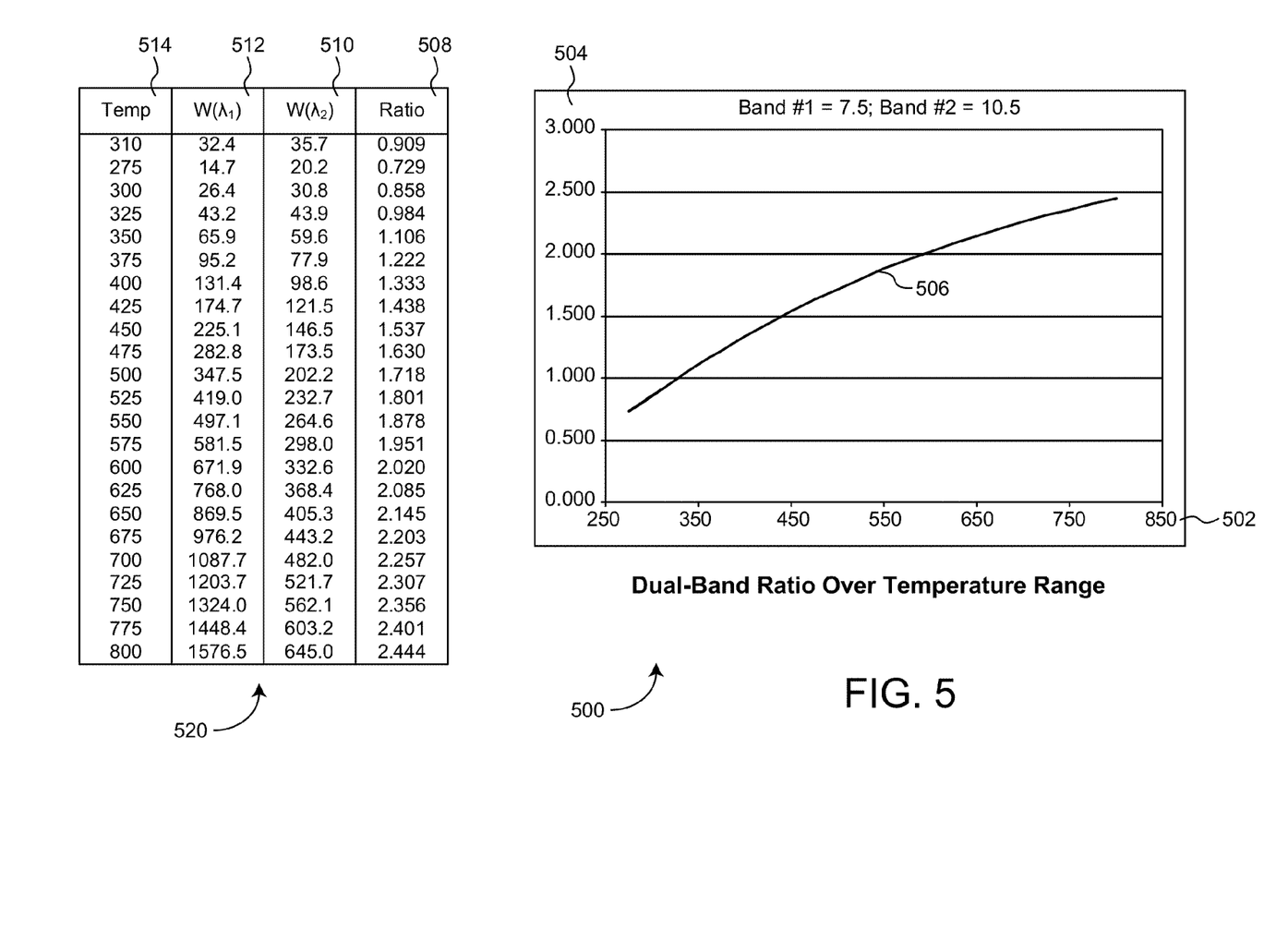
FIG. 5 is a chart depicting the relationship between the ratio of detected radiance at a first and second wavelength and temperature according to one exemplary embodiment.

For example, FIG. 5 depicts a table 520 of radiance levels detected by PAD 100 at a first wavelength 512 and second wavelength 510. As shown in table 520, dividing the first lower wavelength by the second higher wavelength results in a ratio that is directly related to the temperature of the radiating body emitting the first and second wavelengths. Furthermore, as shown in chart 500, the temperature on x axis 502 for detected radiating bodies increases monotonically according to curve 506 as the ratio of wavelength one divided by wavelength two on axis y 504 increases. Determining temperature in this manner allows for a direct determination of the temperature of detected radiating bodies compared with conventional thermal imaging systems which must calibrate first in order to infer temperature.

This dual energy temperature determination can be implemented in PAD 100 by dividing each pixel detector 116, 118 and 120 in PAD 100 into subsections as shown in pixel detector 102. As discussed previously, the dimensions of metallic nanostructures 106 and 104 results in highly responsive electrical detection of incident radiation 202 from a radiating body at specific wavelengths. Accordingly, metallic nanostructures 106 in sub-pixel section 110 can have dimensions that result in peak responsivity at wavelength λ1 404, while metallic rod 104 in sub-pixel section 108 can be given alternate dimensions that result in peak responsivity at λ2 402. As shown in FIG. 1, metallic rods 106 and 104 may vary in dimension by having different sizes or lengths. Although pixel 102 is shown divided into four sections 108, 110, 112 and 114 to detect both p-polarized light (polarization occurs parallel to the plane of incidence) and s-polarized light (polarization occurs perpendicular to the plane of incidence), sub-pixel 102 is capable of performing thermal detection with only two subsections such as section 106 and 104. Furthermore, other configurations of pixel 102 may divide it into three, five, six or more pixel subsections.

According to one embodiment, pixel detectors 102, 116, 118 and 120 are divided into subsections to increase the likelihood that any single pixel detector in PAD 100 will be focused on a single radiating body. For example, referring to FIG. 6, because each pixel detector in PAD 100 is divided into subsections, each pixel detector will be tuned to two separate wavelengths, λ1 and λ2 radiating from the same body such as a human body 610. Accordingly, each pixel detector will be sensitive to a different portion of the grey body spectrum 406 of the same radiating body 610, for example. In addition, each pixel will be represent a single determined temperature according to one exemplary embodiment.

Figure 10:
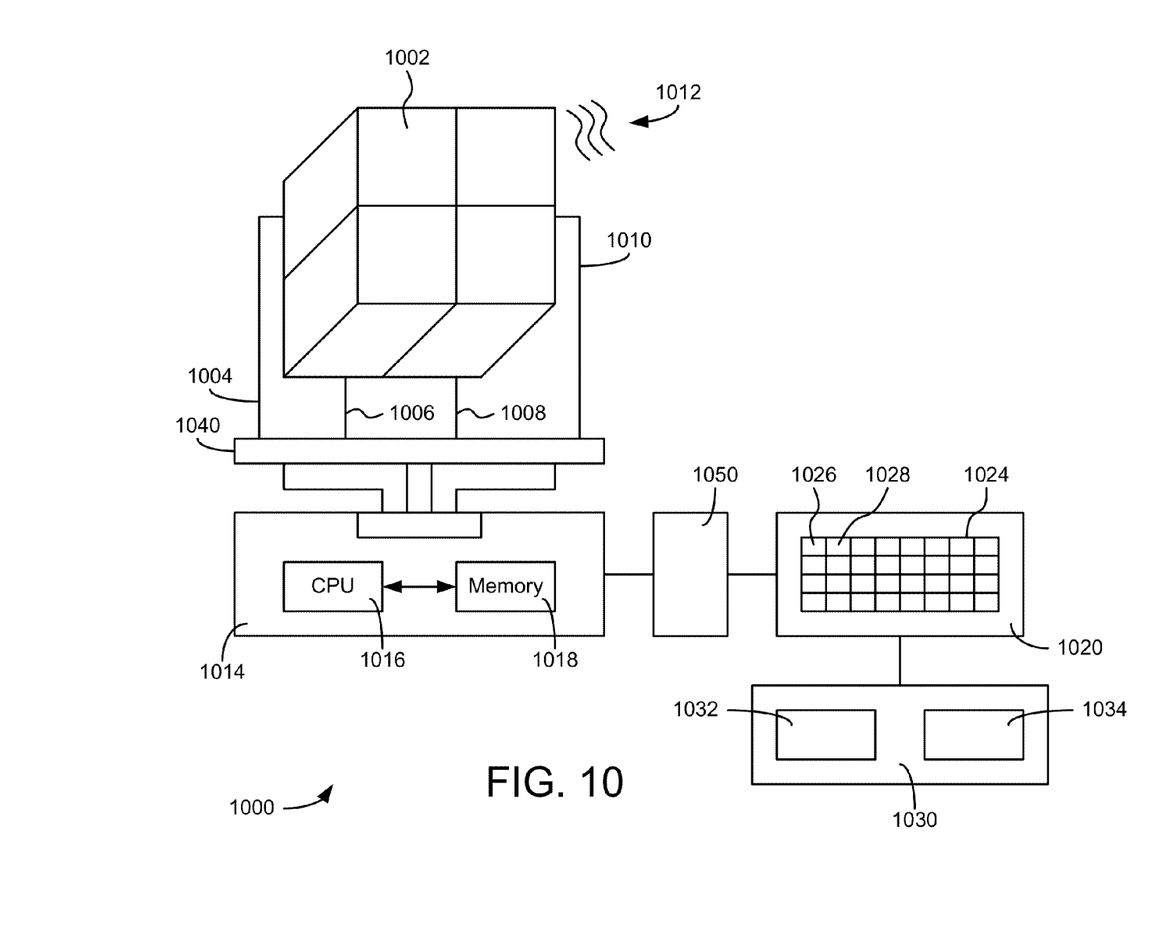
FIG. 10 is a block diagram of one embodiment of the disclosed system.

As discussed previously, this allows a thermal imaging system such as the one shown in FIG. 10 to determine the temperature of a radiating body 610 by calculating the ratio 508 of the first and second wavelengths as shown in table 520 using a LUT stored in memory 1018 or by executing an algorithm with CPU 1016. These determined temperatures can then be translated into pixel data for display on display device 1020. According to one exemplary embodiment, each pixel detector on PAD 100 corresponds to a pixel of display data 1026 or 1028 displayed on display device 1020. The display data may be determined according to the calculated temperature. Scene 602 in FIG. 6 is one example of thermal image data that may be displayed on display device 1020, with ice capped mountains appearing darker because of a lower determined temperature and human body 610 appearing lighter because of a relatively higher determined temperature. Scene 602 in FIG. 6 is one example of wavelength image data that may be displayed on display device 1020, with temperatures close to that of the human body 610 being highlighted for enhanced situational awareness.

Referring again to FIG. 1, according to one embodiment, the dimensions of nanostructures 106 are configured to detect a first wavelength such as a wavelength between 6 and 8 nm and the dimensions of nanostructures 104 are configured to detect a second wavelength such as a wavelength of between 10 and 12 nm. According to another exemplary embodiment, both the first and second wavelengths are anywhere between 1 and 16 nm and where the first wavelength may have a lower value wavelength than the second wavelength, however, longer wavelengths can be selected for the first and second wavelengths. The first and second wavelength must be carefully selected as varying the difference between the first and second wavelengths can result in sub-optimal thermal imaging.

For example, if the first wavelength is selected too close to the second wavelength, the ratio in column 508 will of FIG. 5 will lose accuracy in determining the temperature of the radiating body as shown in column 514. Furthermore, if the first and second wavelengths are selected too far apart, the resulting temporal image will have an increased degree of noise due to the lower level signal detection as the wavelengths move away from the peak wavelength. The most optimal choice for the first and second wavelengths will be dependent upon the application involved, the temperature distribution of scenes to be detected by the PAD 100, and the distance of radiating bodies to be detected, for example. According to one embodiment, as shown in chart 500, the first wavelength was selected at 7.5 nm and the second wavelength was selected at 10.5 nm.

Determining the temperature of radiating bodies according to the disclosed dual wavelength or dual energy system and method has several advantages over conventional thermal detection techniques. A first advantage is that conventional IR sensing techniques that produce thermal images, such as techniques using a microbolometer detector output electrical signals that are a measure of the incident energy of radiating bodies and therefore depend on the temperature and emissivity of the radiating objects captured by a PAD. Accordingly, the strength of the incident signal captured by the PAD is modulated by brightness, distance and attenuation. This is because, as stated previously, the dual wavelength detection technique determines the radiating bodies characteristic temperature based on that bodies' grey body radiation spectrum rather than a measure of radiation that has been attenuated by distance.

Figure 8:
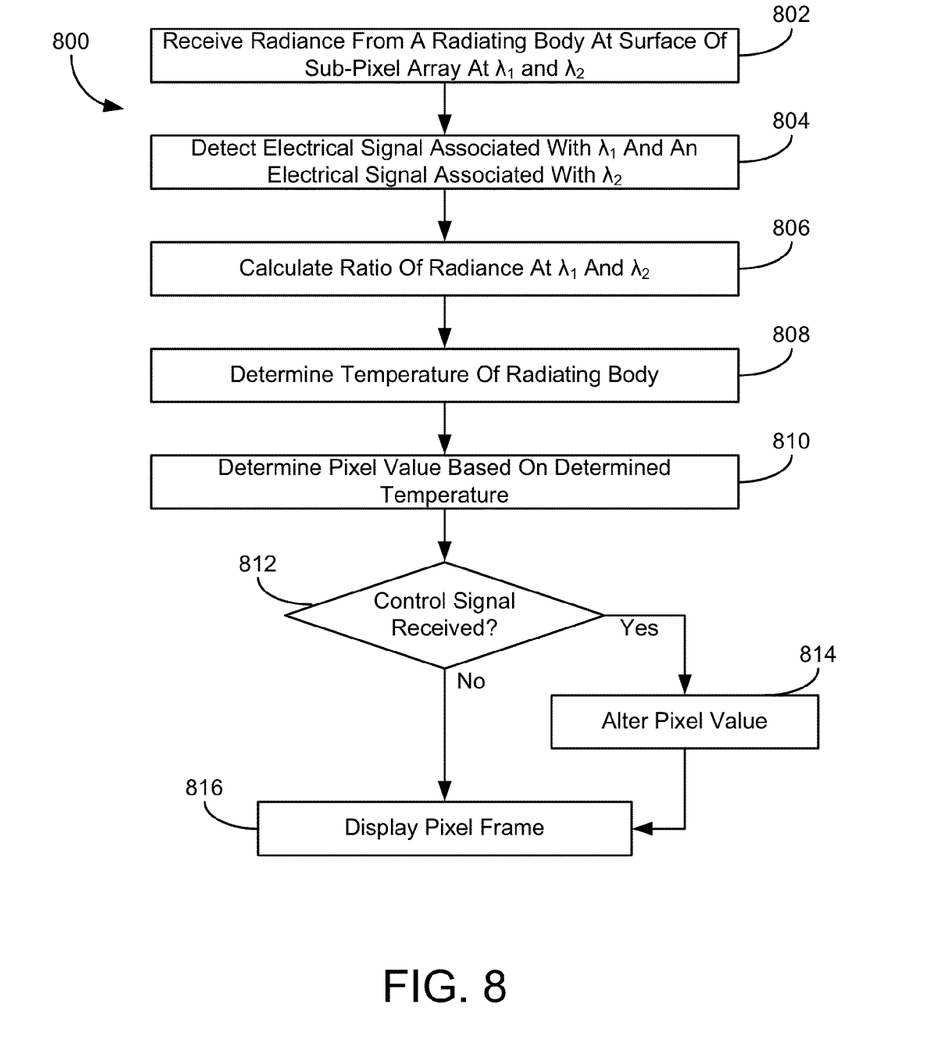
FIG. 8 is a flow chart of the process of detecting radiance from a radiating body to determine the temperature of the radiating body according to one exemplary embodiment.

Additional advantages can be appreciated by reviewing process 800 as shown in FIG. 8. Process 800 may be implemented by system 1000 depicted in FIG. 10, for example and may be performed for each pixel in PAD 100 in a predetermined order. At step 802, radiance 1012 from a radiating body is received at each of pixel detector 1002 in PAD 100. FIG. 10, depicts one such pixel detector 1002 with four sub-pixel sections. The sub pixel sections may be configured as shown in FIG. 1 with parallel rows metallic nanostructures 104, 106 in two sub-pixel sections and parallel columns of metallic nanostructures in two pixel sections, according to one exemplary embodiment. As noted previously, the length of the metallic nanostructures 104 may differ from the length of metallic nanostructures 106 in order to maximize the responsivity of the received radiance 1012 at two predetermined wavelengths. It should be noted that the number of sections may be more or less than four and the number of detected wavelengths may be more than two such as three, four, five or more predetermined wavelengths.

At step 804, process 800 detects the electrical signals 1006 and 1004 associated with a first wavelength (wherein electrical signals 1006 and 1004 detect electric signals from sub-pixel sections that contain metallic nanostructures of a first length 106) and electrical signals 1008 and 1010 associated with a second wavelength (wherein electrical signals 1008 and 1010 detect electric signals from sub-pixel sections that contain metallic nanostructures of a second length 104) at an integrated circuit 1040, also shown in more detail as element 212 in FIG. 2, according to one exemplary embodiment. In another embodiment, integrated circuit 1040 may also detect two electrical signals from two pixel subsections associated with a first and second wavelength if polarization is not accounted for.

At step 806, the radiance communicated by electrical signals such as signals 1006 and 1004 are used to calculate the ratio between the first and second wavelengths as shown in column 508 of FIG. 5. The simple division calculation can be performed using processor 1016 or by entering the two wavelengths into a LUT stored in memory 1018 according to two exemplary embodiments. At step 808, once the ratio of the first and second wavelengths has been determined, the temperature of the radiating body that emitted radiation 1012 to pixel detector 1002 is determined. For example, the temperature may be determined by entering the ratio such as the ratios shown in column 508 into a LUT and receiving an output value indicating temperature such as the temperature values shown in column 514. Alternatively, the temperature may be calculated at 808 using an algorithm or polynomial equation that may take into account other factors such as calibration settings.

Figure 9:
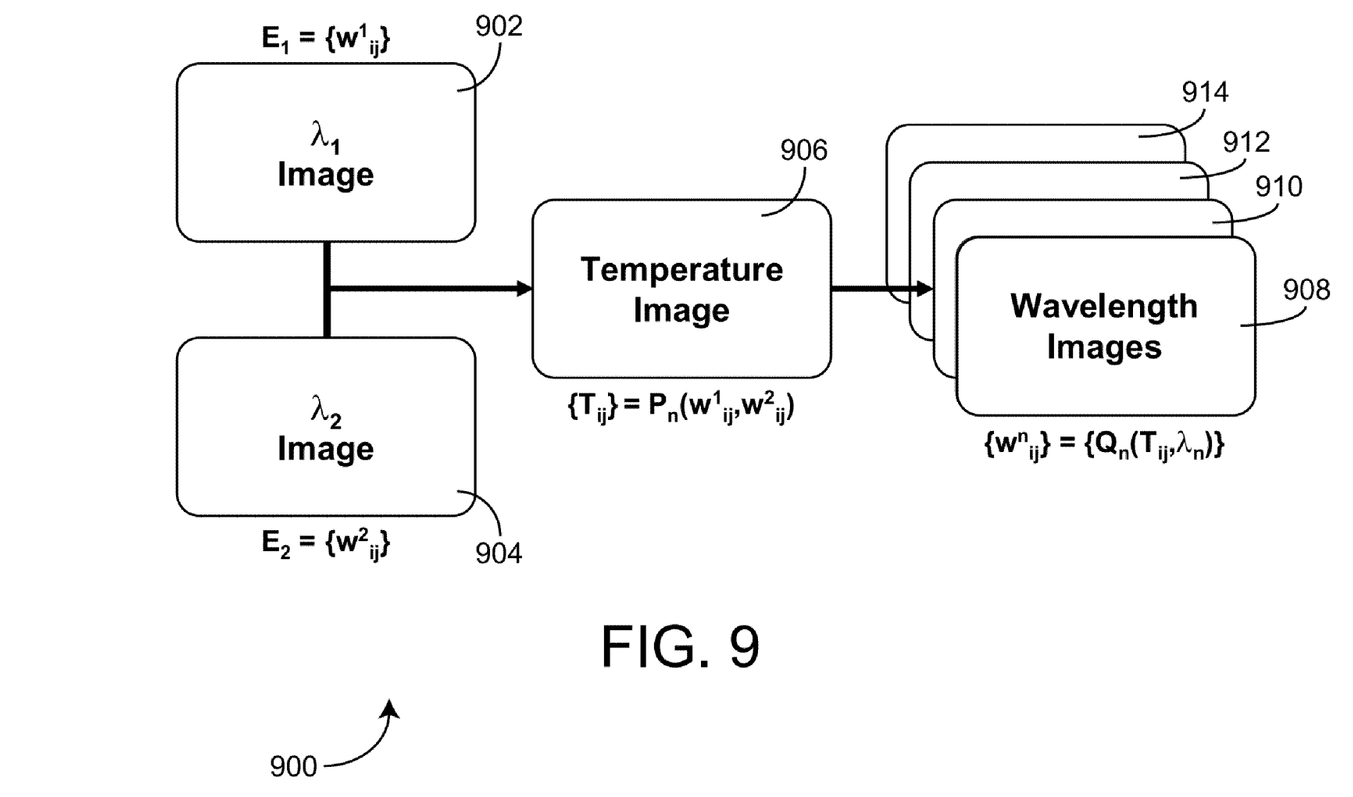
FIG. 9 is a block diagram depicting the selected wavelength variations of a temperature image.

Furthermore, steps 806 and 808 are conceptualized in FIG. 9. Because each pixel detector 1002 captures a first wavelength image 902 and a second wavelength image 904, PAD 100 senses images of at two wavelengths simultaneously, as shown in FIG. 9. Element 906 depicts the step 808. At 906, the images at both wavelengths, 902 and 904 can be entered into a LUT stored in memory 1018 to output a temperature Tij for each pixel in PAD 100. The temperature for each pixel may be determined at element 906 in any predetermined order. For example, the pixel detectors in PAD 100 may be referred to in a row (i) and column (j) format so that the temperature for pixel 118 at position (i, j) may be calculated first and pixel 116 at position (i, j+1) is calculated second, etc. Once the temperature for each pixel in the image is determined at element 906, the black body spectrum for each pixel, such as curve 406 shown in FIG. 4, can also be determined.

The shape of the black body curve is universal and the peak of curve 406 shifts across the x axis of FIG. 4 depending on temperature. Accordingly, once the temperature is known and the radiating body can be displayed on a thermal image at many different wavelengths. For example, referring to FIG. 4, if the temperature is determined to be 300 degrees Kelvin according to the ratio of wavelengths λ1 and λ2, the emitted energy at any wavelength of the black body curve 406 can be determined by inserting the temperature T into equation (1), wherein I is spectral radiance, v is frequency, h is Planck's constant, c is the speed of light, and k is Blotzmann's constant.

$$I(v, T) = \frac{2hv^3}{c^2} \frac{1}{e^{hv/kT} - 1} \quad (1)$$

Furthermore, because blackbody curve 406 is known for a given pixel detector such as pixel detector 102, the pixels in a temperature image could be tuned to specific wavelength images 1008, 1010, 1012, and 1014, for example.

This wavelength tuning feature could be implemented at steps 812 and 814 in process 800, with a control signal from an external I/O device 1030, for example. Additionally, control signal from I/O device 1030 could be used at steps 812 and 814 to enhance specific wavelengths or a range of wavelengths in a thermal image 602 as shown in FIG. 6. In FIG. 6, an exemplary wavelength range 612 is depicted. The range of wavelengths may be selectable by a control signal from an I/O device 1030, for example. The control signal selects a wavelength level 608 or wavelength range 606 to highlight a particular wavelength in the thermal image 602.

As shown in FIG. 6, a color associated with the selected wavelength level 608 can be selected from amongst a range of wavelengths, shown by element 612 as ranging from 1 to 14 microns. The selected wavelength level 608 or wavelength range 606 may be selected by a control signal from an I/O device 1030, according to one embodiment. Once the control signal is received at step 812 in process 800, bodies in a displayed thermal image such as image 802 that radiate a peak wavelength at the selected wavelength level 808 will be highlighted at step 814 of process 800, according to one exemplary embodiment. Various radiating bodies have emanate radiation at varying peak wavelengths.

For example, human emanate radiation at a peak wavelength of approximately 9.35 microns, while hot engines emanate radiation at a peak wavelength of approximately 5 microns. Accordingly, in displayed image 602, a wavelength window from approximately 9-10 microns is selected, resulting in human body 610 being highlighted in a predetermined color. As noted by step 816, this process 800 takes place continually on a frame by frame basis, according to one exemplary embodiment. Once the pixel values for a pixel frame have been determined at step 816, the frame of pixel data may be displayed at display device 1020, according to one embodiment. Furthermore, the frames of pixel data may be further conditioned at software module 1050 to perform image filtering, as object detection, or other various image conditioning processes. Moreover, those pixels corresponding to human-body temperatures could be highlighted in one predetermined color and those corresponding to a hot engine at a second predetermined color.

System 1000 may be implemented in a wide variety of systems such as thermal imaging systems or medical imaging systems, for example. Specifically, system 1000 may be implemented in military targeting systems, medical imaging display systems, land based vehicle HUD, HMD, or head down display systems or aircraft HUD, HMD or head down display systems. Furthermore, display 1020 may be any variety of pixilated displays, including, but not limited to a liquid crystal display (LCD). Further, display 1120 may be a head-up or a head-down display. System 1000 can further receive data 120 from a plurality of sources including, but not limited to sensors, inertial reference units, air data, terrain data, navigation receiver data, etc. In one exemplary embodiment, PAD 100 including exemplary pixel detector 1002 can be mounted on the exterior of an aircraft or vehicle to detect conditions such as terrain, weather conditions, the presence of other aircraft, a runway path, potential targets for a weapon system, other vehicles, or humans, for example.

While the detailed drawings, specific examples and particular formulations given describe preferred and exemplary embodiments, they serve the purpose of illustration only. The inventions disclosed are not limited to the specific forms shown. For example, the methods may be performed in any of a variety of sequence of steps. The hardware and software configurations shown and described may differ depending on the chosen performance characteristics and physical characteristics of the computing devices. For example, the type of computing device, communications bus, or processor used may differ. The systems and methods depicted and described are not limited to the precise details and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. An apparatus for detecting radiance at a plurality of wavelengths comprising:
   an arrayed pixel sensor with a plurality of sub-pixel sections comprising:
   a first sub-pixel section configured to detect radiance received from a radiating body at a first wavelength; and
   a second sub-pixel section configured to detect radiance received from the radiating body at a second wavelength;
   an array of metallic nanostructures embedded in a dielectric medium contained in the plurality of sub-pixel sections wherein the metallic nanostructures have a first dimension for at least a first sub-pixel section and a second dimension for at least a second sub-pixel section;
   an electrical detector functionally connected to each sub-pixel section;
   at least one memory; and
   at least one processor configured to execute computer program stored in the at least one memory to:
   determine a ratio of the radiance detected at the first wavelength and the radiance detected at the second wavelength; and
   determine a parameter of the radiating body based on the ratio.

2. The apparatus of claim 1, wherein the parameter is temperature and the at least one processor is further configured to determine pixel values based on the temperature associated with the ratio.

3. The apparatus of claim 1, wherein the metallic nanostructures of the first dimension and the metallic nanostructures of the second dimension both have characteristic dimensions between 1 and 1000 nanometers.

4. The apparatus of claim 2, wherein the pixel values are displayed to a user on a display device.

5. The apparatus of claim 2, wherein the pixel values associated with at least one of a wavelength or wavelength range can be selected and displayed according to a control signal.

6. The apparatus of claim 1, wherein the first and second wavelengths are infrared wavelengths.

7. The apparatus of claim 1, wherein the array of metallic nanostructures are an array of gold nano-rods.

8. The apparatus of claim 1, wherein the ratio changes monotonically as the temperature of the radiating body changes.

9. The apparatus of claim 1, wherein the parameter is temperature and the temperature of the radiating body is determined by entering the ratio into a look up table.

10. The apparatus of claim 1, wherein each sub-pixel section in the arrayed pixel sensor outputs an electrical signal that is used to detect radiance of a radiating body.

11. The apparatus of claim 10, wherein the electrical output signal is detected as the result of resonantly excited electrons passing over or through a Schottky barrier, forming an electrical signal.

12. A method for determining a thermal image based on radiance detected from a radiating body at a plurality of wavelengths, comprising:
    detecting radiance received from a radiating body at a first wavelength using a first sub-pixel section of an arrayed pixel sensor comprising an array of metallic nanostructures of a first dimension;
    detecting radiance received from the radiating body at a second wavelength using a second sub-pixel section of the arrayed pixel sensor comprising an array of metallic nanostructures of a second dimension;
    determining a ratio of the radiance detected at the first wavelength and the radiance detected at the second wavelength; and
    determining a parameter of the radiating body based on the ratio.

13. The method of claim 12, wherein the parameter is temperature.

14. The apparatus of claim 12, wherein the metallic nanostructures of the first dimension and the metallic nanostructures of the second dimension are both have characteristic dimensions between 1 and 1000 nanometers.

15. The method of claim 13, wherein the at least one processor is further configured to execute a computer program stored in the at least one memory to determine pixel values based on the temperature associated with the ratio and the pixel values associated with one of a particular wavelength or range of wavelengths can be selected and displayed according to a control signal.

16. The method of claim 13, wherein the at least one processor is further configured to execute a computer program stored in the at least one memory to determine pixel values based on the temperature associated with the ratio and the pixel values are displayed to a user on a display device.

17. The method of claim 12, wherein the first and second wavelengths are in the infrared region of wavelengths.

18. The method of claim 12, wherein the array of metallic nanostructures are an array of gold nano-rods.

19. The method of claim 12, wherein the array of metallic nanostructures are contained in a dielectric substrate and each sub-pixel section in the arrayed pixel sensor outputs an electrical signal that is used to detect radiance of a radiating body.

20. The method of claim 19, wherein each of the electrical output signal is detected as the result of resonantly excited electrons passing over or through a Schottky barrier, forming an electrical signal.

21. The method of claim 12, wherein the ratio changes monotonically as temperature changes.

* * * * *